United States Patent
Jacobson

(10) Patent No.: US 7,610,534 B1
(45) Date of Patent: Oct. 27, 2009

(54) DETERMINING A LENGTH OF THE INSTRUCTION REGISTER OF AN UNIDENTIFIED DEVICE ON A SCAN CHAIN

(75) Inventor: Neil G. Jacobson, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 434 days.

(21) Appl. No.: 11/725,664

(22) Filed: Mar. 20, 2007

(51) Int. Cl.
G01R 31/28 (2006.01)
(52) U.S. Cl. .................. 714/726; 714/727; 714/729
(58) Field of Classification Search .......... 714/726, 714/727, 729
See application file for complete search history.

(56) References Cited

U.S. PATENT DOCUMENTS

| | | | |
|---|---|---|---|
| 5,682,392 A * | 10/1997 | Raymond et al. ........... | 714/727 |
| 6,829,730 B2 * | 12/2004 | Nadeau-Dostie et al. ...... | 714/30 |
| 6,886,110 B2 * | 4/2005 | O'Brien ...................... | 714/34 |
| 6,948,147 B1 | 9/2005 | New et al. | |
| 2007/0188351 A1 * | 8/2007 | Brown et al. ................ | 340/999 |

OTHER PUBLICATIONS de Jong et al., SiP-TAP: JTAG for SiP, Oct. 2006, IEEE, pp. 1-10.*
Oakland et al., Considerations for implementing IEEE 1149.1 on system-on-a-chip integrated circuits, Oct. 3-5, 2000, IEEE, pp. 628-637.*

* cited by examiner

*Primary Examiner*—John J Tabone, Jr.
(74) *Attorney, Agent, or Firm*—LeRoy D. Maunu; Lois D. Cartier

(57) ABSTRACT

Methods and systems are provided for determining a total length of instruction registers. A data shift of a scan chain determines whether each device in the scan chain is an identified device. An overall length of the instruction registers of the devices is determined from an instruction shift. An actual position is determined for an identified device between each pair of sub-sequences of unidentified devices. An instruction shift of the scan chain attempts to set the respective instruction register of the identified device using one or more trial positions. If a data shift of the scan chain obtains the recognized value of the respective identification register of the identified device for one of the trial positions, then this trial position is the actual position within the overall length. The total length is determined for the instruction registers of the unidentified devices in each sub-sequence of the unidentified devices.

20 Claims, 4 Drawing Sheets

DETERMINING A LENGTH OF THE INSTRUCTION REGISTER OF AN UNIDENTIFIED DEVICE ON A SCAN CHAIN

FIELD OF THE INVENTION

The present invention generally relates to scan chains, and more particularly to automatically determining characteristics of unidentified devices on a scan chain.

BACKGROUND

A scan controller can test the devices on a scan chain with a minimal amount of extra circuitry. Each device on a scan chain may include a test access port (TAP), and the scan controller may control the TAP of each device using control signals that include a test clock signal, a test mode select signal, a test data input, and a test data output. The scan controller may directly control the test clock signal and the test mode select signal of each device on the scan chain. A sequence of devices may form the scan chain with the test data output of the scan controller connected to the test data input of the first device in the sequence, the test data output of each device in the sequence connected to the test data input to the next device in the sequence until the last device in the sequence, and the test data output of the last device in the sequence connected to the test data input of the scan controller.

The TAP in each device on the scan chain includes a state machine that makes a state transition for each rising edge of the test clock signal to one of two states as selected by the value of the test mode select signal from the scan controller. Even though the TAP in each device on the scan chain may have a separate state machine, generally each state machine is in the same state as controlled by the scan controller.

While the state machines of the TAPs may have synchronized states, the TAP of each device may perform differing tests depended upon the value of an instruction register of the TAP. A shift-instruction state of the state machines of the TAPs of the devices on the scan chain may serially shift one instruction bit from the test data output of the scan controller through the concatenation of the instruction registers of the TAPs of all of the devices on the scan chain. The scan controller may set the instruction registers of each TAP to an individually selected instruction by repeating the shift-instruction state to shift the bits of these instructions through the scan chain.

To set the instruction register of the TAP of each device on the scan chain successfully, the scan controller should have the length of each device's instruction register. If the length of one instruction register is not available, the scan controller might not be able to set the instruction registers of any TAP successfully. Frequently, the configuration, including the length of the instruction register, of the TAP of each device on the scan chain is provided to the scan controller. However, the configuration of certain devices on the scan chain might not be available. For example, the hardware that implements a scan chain may have jumpers that permit the addition of unknown devices to a scan chain. The addition of an unknown device to a scan chain may render the scan chain inoperable for all of the devices on the scan chain.

The present invention may address one or more of the above issues.

SUMMARY

Various embodiments of the invention provide a method for determining a total length of at least one instruction register. A data shift of a scan chain determines whether each of the devices in the scan chain is an identified device. An overall length of the instruction registers of the devices is determined from an instruction shift of the scan chain.

An actual position is determined for each pair of sub-sequences of unidentified devices that are separated in the scan chain by a sub-sequence of identified devices. Each actual position is determined for the respective instruction register of an identified device between the pair of sub-sequences of unidentified devices. An instruction shift of the scan chain attempts to set the respective instruction register of the identified device using one or more trial positions. If a data shift of the scan chain obtains the recognized value of the respective identification register of the identified device for one of the trial positions, then this trial position is the actual position within the overall length.

The total length is determined for the instruction registers of the unidentified devices in each sub-sequence of the unidentified devices. Each total length is determined as a function of the overall length of the instruction registers of the devices, the actual position within the overall length for the respective instruction register of the identified device between each pair of sub-sequences of unidentified devices, and a length of the respective instruction register of each identified device.

Various other embodiments provide a system for determining a total length of at least one instruction register. The system includes a scan controller and multiple devices that are coupled to form a scan chain. Each device has a respective instruction register.

The scan controller determines from a data shift of the scan chain whether each device in the scan chain is an identified device that has a respective identification register with a recognized value. An overall length of the instruction registers of the devices is determined from an instruction shift of the scan chain.

An actual position within the overall length is determined for the respective instruction register of an identified device in a sub-sequence of identified devices separating each pair of sub-sequences of unidentified devices. The scan controller determines the actual position within the overall length for the respective instruction register of the identified device using one or more trial positions. For each trial position, an instruction shift of the scan chain attempts to set the respective instruction register of the identified device using the trial position within the overall length. The instruction shift of the scan chain attempts to set the respective instruction registers of the devices to select the respective identification register for the identified device and to select a respective bypass register for the devices other than the identified device. The trial position is determined to be the actual position when a data shift of the scan chain obtains the recognized value of the respective identification register of the identified device.

The scan controller determines a total length of the respective instruction register of every unidentified device in each sub-sequence of unidentified devices.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
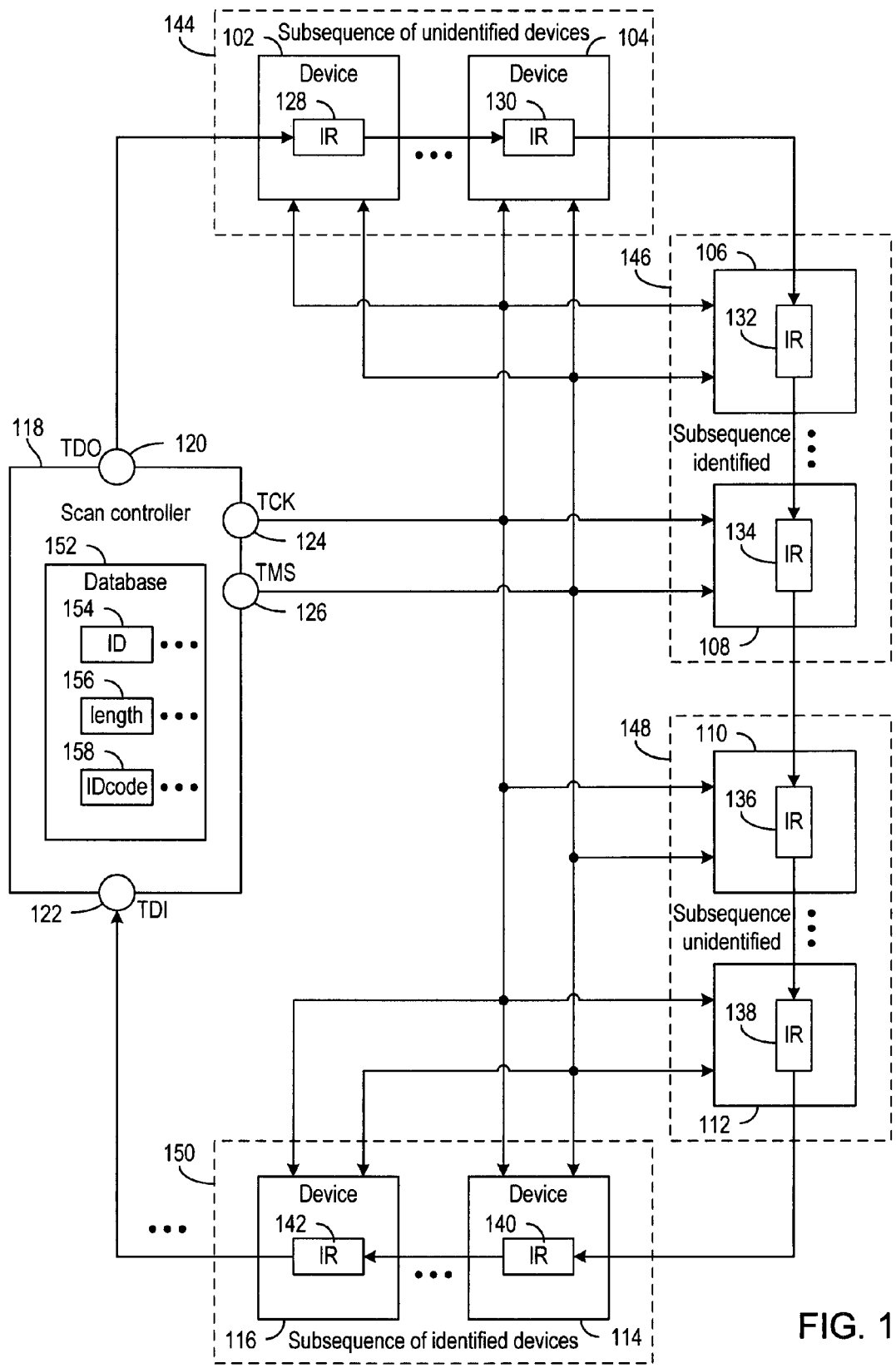
FIG. 1 is a block diagram of devices coupled in a sequence to form a scan chain in accordance with various embodiments of the invention.

FIG. 1 is a block diagram of devices 102, 104, 106, 108, 110, 112, 114, and 116 coupled in a sequence to form a scan chain in accordance with various embodiments of the invention. A scan controller 118 may control the operation of the scan chain.

The scan controller 118 may have a test data out (TDO) signal 120 that connects to the start of the scan chain and a test data input (TDI) signal 122 that connects to the end of the scan chain. The scan controller 118 may output a test clock (TCK) signal 124 and a test mode select (TMS) signal 126 that connect in parallel to the devices 102 through 116. State machines (not shown) in the devices 102 through 116 may make parallel state transitions for each rising edge of the TCK signal 124, with the next state of each state machine selected by the value of the TMS signal 126. In certain states of these state machines, one bit of data may shift through the instruction registers 128, 130, 132, 134, 136, 138, 140, and 142 of the scan chain for each rising edge of the TCK signal 124.

Each of the devices 102 through 116 may be either an identified device or an unidentified device. Certain of the devices 102 through 116 may include a device identification register (not shown) and the identified devices 106, 108, 114, and 116 may have a value for the device identification register that is present in database 152. Unidentified devices 102, 104, 110, and 112 either do not have a device identification register or have a value for the device identification register that is not present in database 152.

The sequence of devices 102 through 116 may be separated into alternating sub-sequences 144, 146, 148, and 150 of identified and unidentified devices. Thus, the scan chain may interleave sub-sequences 144 and 148 of unidentified devices between sub-sequences 146 and 150 of identified devices. Sub-sequences 144 and 148 are a pair of successive sub-sequences of unidentified devices 102, 104, 110, and 112 that are separated by sub-sequence 146 of identified devices 106 and 108. It will be appreciated that each sub-sequence of identified or unidentified devices may include one or more devices.

The database 152 may be associated with the scan controller 118. The database 152 may include the identifier 154 of each recognized device. The database 152 may also include certain characteristics of each recognized device. For example, the database 152 may include a length 156 of the instruction register and an identification instruction 158 for each recognized device. When the identification instruction 158 is loaded into the instruction register of the device having a value of the device identification register that matches identifier 154, the device may provide access via the scan chain to the identifier value from the device identification register.

The lengths of the instructions registers 132, 134, 140, and 142 of the identified devices 106, 108, 114, and 116 may be obtained from the database 152. Various embodiments of the invention permit determining the total length of the instruction registers in each sub-sequence 144 and 148 of unidentified devices from the lengths of the instructions registers 132, 134, 140, and 142 of the identified devices 106, 108, 114, and 116 and the overall length of the instruction registers 128 through 142 of all of the devices 102 through 116. Thus, the total length may be determined for the instruction registers 128 and 130 of sub-sequence 144 of unidentified devices 102 and 104, and total length may be determined for the instruction registers 136, and 138 of the sub-sequence 148 of unidentified devices 110 and 112. It will be appreciated that the length of the instruction register of an unidentified device may be determined when the unidentified device is included in a sub-sequence of unidentified devices that includes only the unidentified device.

Figure 2:
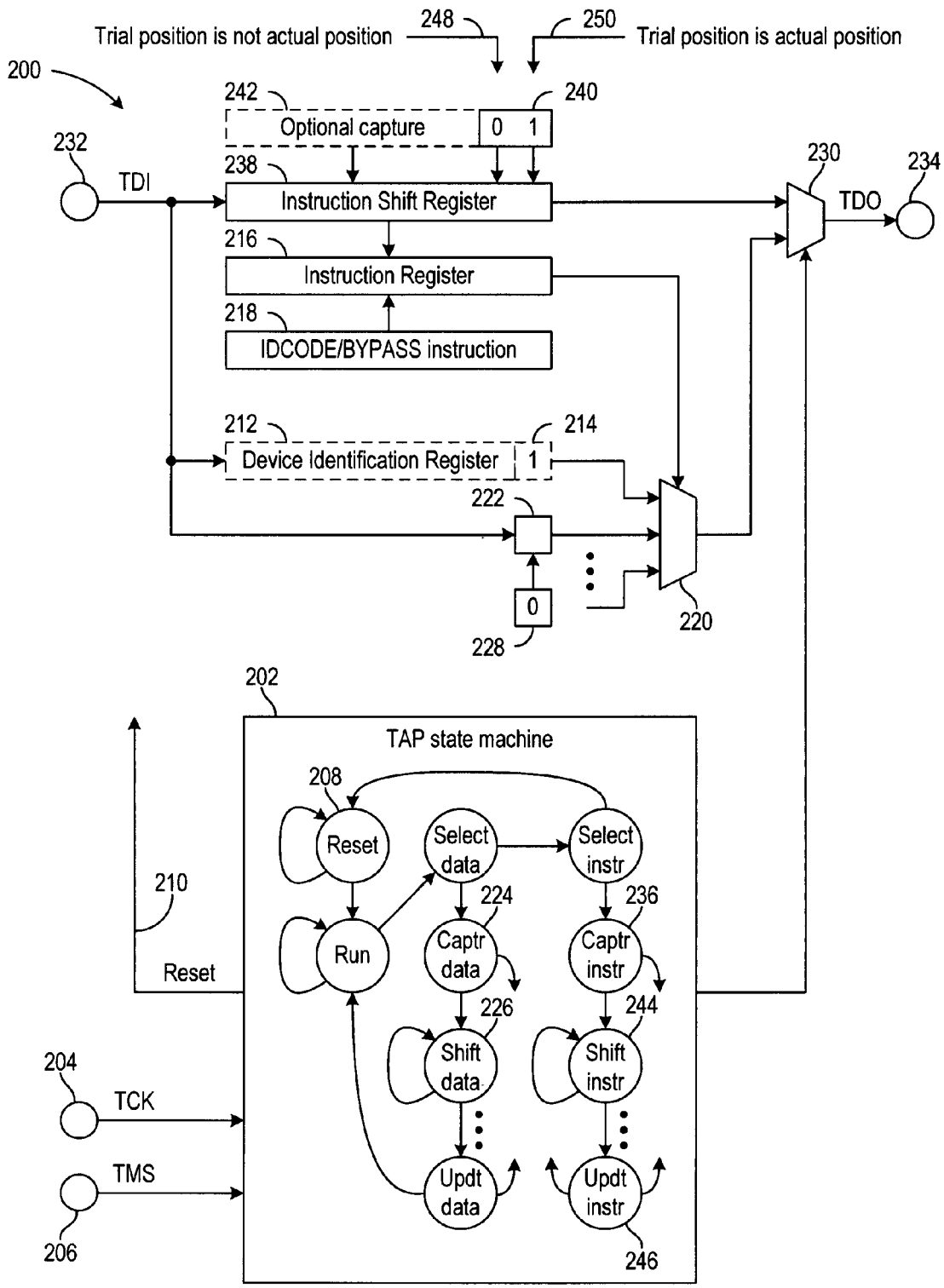
FIG. 2 is a block diagram of a test access port of a device on a scan chain in accordance with various embodiments of the invention.

FIG. 2 is a block diagram of a test access port (TAP) 200 of a device on a scan chain in accordance with various embodiments of the invention. A scan controller may use the TAP 200 to test various features of the device and the device's connections to other devices in an electronic system.

A scan controller may control the TAP 200 by controlling the state of the TAP state machine 202. The TAP state machine 202 may make a state transition for each rising edge of the TCK signal 204. Each state of the TAP state machine 202 may transition to one of two possible next states depending on the value of the TMS signal 206 at the rising edge of the TCK signal 204. In one embodiment, the scan controller may force the TAP state machine 202 into the reset state 208 by providing an asserted TMS signal 206 for five or more cycles of the TCK signal 204. The TAP state machine 202 may assert a reset signal on line 210 while the TAP state machine 202 is in the reset state 208.

A device may include an optional device identification register 212. A device identification register 212 may have a fixed value that encodes the manufacturer and a part number for the device. Thus, the type of device may be determined by obtaining the value of a device identification register 212. The fixed value for the device identification register 212 may also include a least significant bit 214 that always has a value of one. In one embodiment, the device identification register 212 is a thirty-two bit register including an identification value with thirty-one bits and the least significant bit 214.

The asserted reset signal on line 210 may initialize the instruction register 216 with an instruction code 218. For a device that does include the device identification register 212, the instruction code 218 may be the identification instruction for the device. For a device that does not include the device identification register 212, the instruction code 218 may be the bypass instruction.

The value of the instruction register 216 may control multiplexer 220. Multiplexer 220 may select the bypass register 222 when the value of the instruction register 216 is the bypass instruction. For a device that includes the device identification register 212, multiplexer 220 may select the device identification register 212 when the value of the instruction register 216 is the identification instruction for the device. Multiplexer 220 may select other sources when additional instructions are loaded into the instruction register 216.

After resetting the TAP state machine 202, the scan controller may advance the TAP state machine 202 to the capture data state 224. In the capture data state 224, the bypass register 222 may be updated with a zero-bit 228.

The scan controller may next advance the TAP state machine 202 to the shift data state 226. In the shift data state 226, the TAP state machine 202 may direct the multiplexer 230 to select the output of multiplexer 220. In the shift data state 226, each cycle of the TCK signal 204 may shift one bit of data into the TAP 200 at the TDI signal 232 and shift one bit of data out of the TAP 200 at TDO signal 234. The data may shift through the register selected by the instruction register 216. If the instruction register 216 is set to the identification instruction, then the data shifts through the device identification register 212. If the instruction register 216 is set to the bypass instruction, then the data shifts through the bypass register 222.

The first data shift following a reset may shift out at the TDO signal 234 either a zero-bit from the bypass register 222 or a one-bit 214 from the device identification register 212. Thus, if the first data shift after reset outputs a zero-bit at TDO signal 234, then the TAP 200 does not include a device identification register and the next data shift may output a value received at the TDI signal 232. However, if the first data shift after reset outputs a one-bit at TDO signal 234, then the TAP 200 includes a device identification register 212 and subsequent data shifts may output the identification value from the device identification register 212.

When a sequence of devices are connected to form a scan chain, the TDO signal 234 of a device in the scan chain may be connected to the TDI signal 232 of the next device in the scan chain. The TDO signal of the scan controller may connect to the TDI signal 232 of the first device in the scan chain and the TDO signal 234 of the last device in the scan chain may connect to the TDI signal of the scan controller. The scan controller can reset each TAP 200 in the devices on the scan chain and subsequently perform data shifts to obtain either the identification value for each TAP 200 that includes a device identification register 212, or a zero-bit for each TAP 200 that does not include a device identification register 212.

The scan controller may supply one-bits to the scan chain during the data shifting. When these one-bits have shifted through the entire scan chain, the scan controller receives these one-bits from the scan chain. The scan controller may initially interpret these one-bits as another device on the scan chain that has a device identification register with a value of all one-bits for the identification value. The identification value of all one-bits may be a reserved value for indicating the end of the scan chain. The scan controller may then complete the data shift and exit the shift data state 226 of the TAP state machine.

The devices with a TAP 200 that does not include a device identification register 212 may be unidentified devices. For devices that include a device identification register 212, the scan controller may check the identification value from the device identification register 212 against a database of recognized devices. If the identification value is in the database, then the device is an identified device. If the identification value is not in the database, then the device is an unidentified device.

While generally the TAP state machine 202 of each device on a scan chain is in the same state, such as the shift data state 226, the TAP 200 of each device may be set up to perform a different test by supplying a different instruction to the instruction register 216 of each device. For example, the instruction register 216 of one device on the scan chain may be set to an identification instruction and the instruction registers of the other devices on the scan chain may be set to a bypass instruction. A subsequent data shift may obtain a zero-bit from all but one device. From this one device, the data shift may obtain the identification value of the device.

To set the value of the instruction register 216, the scan controller may first set up the value in the instruction shift register 238 and then transfer this value from the instruction shift register 238 to the instruction register 216. The scan controller may first advance the TAP state machine 202 to the capture instruction state 236. In the capture instruction state 236, the instruction shift register 238 may be initialized with a fixed value 240 and an optional capture value 242. The combination of the values 240 and 242 matches the length of the instruction shift register 238, and the length of the instruction shift register 238 matches the length of the instruction register 216. The minimum length of the registers 216 and 238 is two bits. If registers 216 and 238 have the minimum length, then the optional capture value 242 is not included in TAP 200. Otherwise, the optional capture value 242 is included in TAP 200 and has the appropriate length to initialize the instruction shift register 238 in combination with the fixed value 240.

After initializing the instruction shift register 238 in the capture instruction state 236, the scan controller may advance the TAP state machine 202 to the shift instruction state 244. In the shift instruction state 244, the TAP state machine 202 may direct the multiplexer 230 to select an output of the instruction shift register 238. In the shift instruction state 244, each cycle of the TCK signal 204 may shift one instruction bit into the TAP 200 at the TDI signal 232 and shift one instruction bit out of the TAP 200 at TDO signal 234. By repeating the shift instruction state 244, the scan controller may obtain the fixed value 240 and optional capture value 242 from each TAP 200 on the scan chain and may set the value of the instruction shift register 238 to any selected instruction.

After setting the instruction shift register 238 to the selected instruction, the scan controller may advance the TAP state machine 202 to the update instruction state 246. In the update instruction state 246, the value of the instruction shift register 238 may be transferred to the instruction register 216. Thus, the scan controller can select a respective instruction for each device on a scan chain and set the instruction register 216 of each device to the respective instruction.

To successfully set the value of the instruction register 216 of each device on a scan chain, the scan controller may need to have the length of the instruction register 216 of each device on the scan chain. If the scan chain only includes identified devices, the scan controller may obtain the length of the instruction register for each device from a database of recognized devices. If an unrecognized device is on a scan chain between the scan controller and an identified device that includes TAP 200, the scan controller may not be able to determine the amount of instruction shifting needed to shift a selected instruction into the instruction shift register 238 of the identified device. Various embodiments of the invention permit successful setting of the value of the instruction register 216 of each device on a scan chain even though the scan chain includes unidentified devices.

In various embodiments of the invention, the scan controller may check a trial position at arrow 248 for the least significant bit of the instruction shift register 238. The scan controller may check the trial position at arrow 248 to determine whether the trial position is the actual position of the least significant bit of the instruction shift register 238 of the identified device. The scan controller may attempt to use the trial position at arrow 248 in an instruction shift for setting the instruction shift register 238 to the identification instruction of the identified device. The scan controller may then transfer this identification instruction from the instruction shift register 238 to instruction register 216 of the identified device. The scan controller may also attempt to set the instruction registers of the other devices on the scan chain to a bypass instruction. The scan controller may then perform a data shift that attempts to retrieve the value of the device identification register 212 of the identified device. In this example, the trial position at arrow 248 is not the actual position of the least significant bit of the instruction shift register 238, so the data shift does not successfully retrieve the value of the device identification register 212. Because the value of the device identification register 212 is not successfully retrieved, the scan controller may determine that the trial position at arrow 248 is not the actual position in the scan chain of the least significant bit of the instruction shift register 238.

The scan controller may next check another trial position at arrow 250 for the least significant bit of the instruction shift register 238. Again, the scan controller may attempt to use the trial position at arrow 250 in an instruction shift for setting the instruction register 216 of the identified device to an identification instruction while attempting to set the instruction registers of the other devices on the scan chain to a bypass instruction. The scan controller may then perform a data shift that attempts to retrieve the value of the device identification register 212 of the identified device. In this example, the trial position at arrow 250 is the actual position of the least significant bit of the instruction shift register 238, so the data shift successfully retrieves the value of the device identification register 212 of the identified device.

Referring back to FIG. 1, the scan controller 118 may similarly determine the actual position in the scan chain of the instruction shift register of identified device 106 and identified device 114, for example. The scan controller 118 may use these actual positions and the length 156 from the database 152 for identified devices 106, 108, and 114 to determine the total length of the instruction shift registers (and the total length of the instruction registers 136 and 138) of the sub-sequence 148 of unidentified devices 110 and 112. The scan controller may similarly determine the total length of the instruction registers 128 and 130 of the sub-sequence 144 of unidentified devices 102 and 104.

Figure 3:
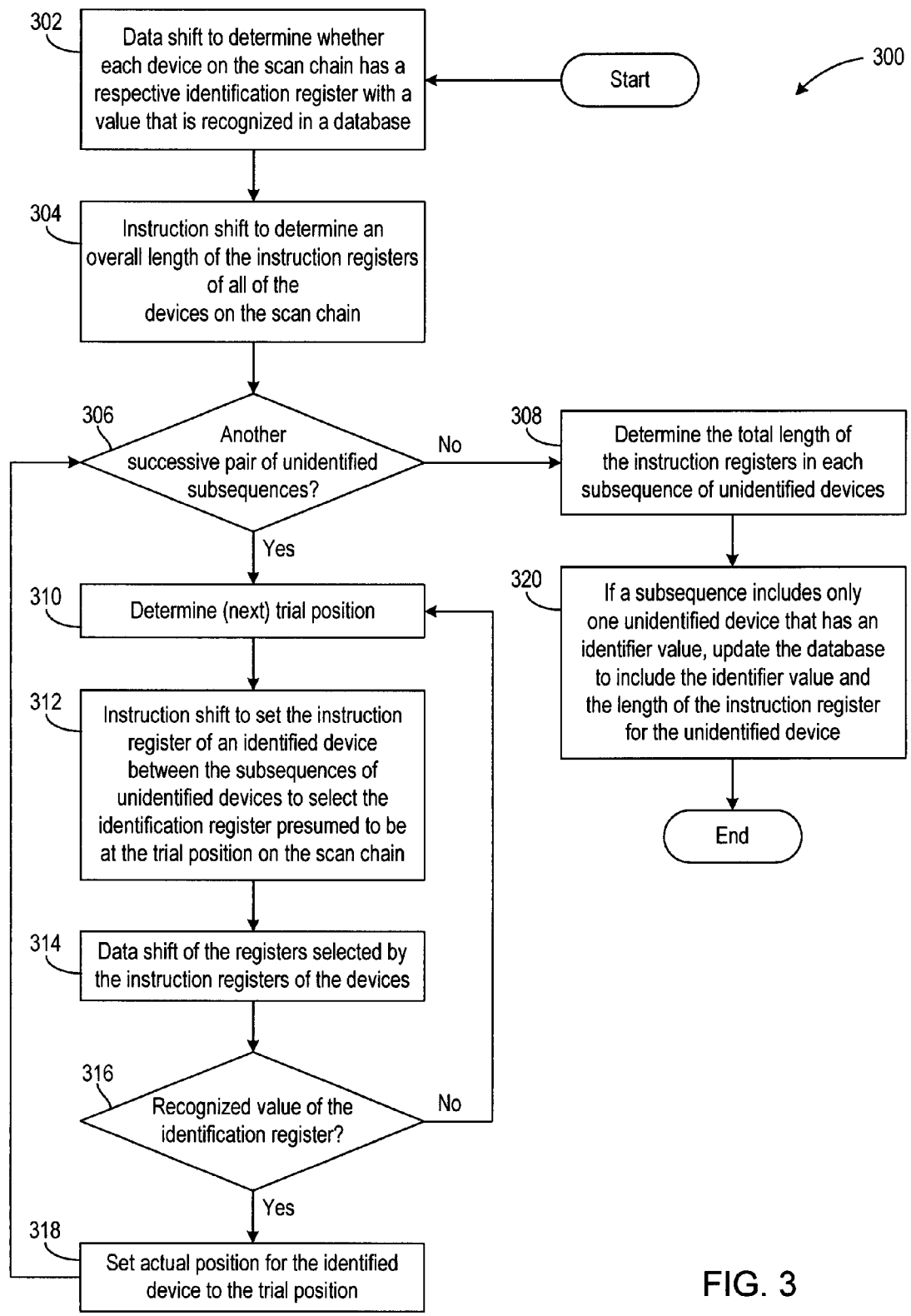
FIG. 3 is a flow diagram of a process for determining a total length of the instruction registers of unidentified devices in accordance with various embodiments of the invention.

FIG. 3 is a flow diagram of a process 300 for determining a total length of the instruction registers of unidentified devices in accordance with various embodiments of the invention. The total length may be determined for the instruction registers within each sub-sequence of unidentified devices on a scan chain. Various possible total lengths may be checked to determine the actual total length of the instruction registers within each sub-sequence of unidentified devices on a scan chain.

At step 302, a data shift of the scan chain may obtain an identification value from each device including a device identification register. For each device on the scan chain that does not include a device identification register, the data shift may also obtain an indication that the device does not include a device identification register. The devices that do not include a device identification register are unidentified devices. For each device that does include a device identification register, the identification value from the device identification register may be checked against a database of recognized devices. If the identification value is in the database, then the device is an identified device. If the identification value is not in the database, then the device is an unidentified device.

At step 304, an instruction shift determines an overall length of the instruction registers of all of the devices on the scan chain. The instruction shift may first initialize the instruction shift registers with a capture data. The length of the instruction shift register of each device may match the length of the instruction register of the device. Each instruction shift register may include a minimum of two bits, and the capture data may include a one-bit for the least significant bit of the instruction shift register and a zero-bit for the next more significant bit of the instruction shift register. In certain embodiments, any remaining bits of the instruction shift register may be initialized with data that may vary between devices, but is a fixed value for a particular device.

The instruction shift may provide a first counted series of one-bits to the scan chain until 256 one-bits are consecutively observed from the scan chain. Because each instruction shift register generally has a length of fewer than 256 bits and is initialized to include both a one-bit and a zero-bit, some, but not necessarily all, of the observed 256 one-bits should be one-bits that were shifted into the scan chain. If the last bit of the capture data that is shifted out of the scan chain is a zero-bit, then the first counted series of one-bits may be 256 bits more than the overall length of the instruction registers of all of the devices on the scan chain. If the last bit of the capture data is a one-bit, then the first counted series of one-bits may be a shorter number of bits.

After reinitializing the instruction shift registers with the capture data, the instruction shift may next provide a second counted series of zero-bits to the scan chain until 256 zero-bits are consecutively observed from the scan chain. Again, some, but not necessarily all, of the observed 256 zero-bits should be zero-bits that were shifted into the scan chain. If the last bit of the capture data that is shifted out of the scan chain is a one-bit, then the second counted series of zero-bits may be 256 bits more than the overall length of the instruction registers of all of the devices on the scan chain. If the last bit of the capture data is a zero-bit, then the second counted series of zero-bits may be a shorter number of bits.

The last bit of the capture data shifted out of the scan chain is either a one-bit or a zero-bit. Thus, either the first counted series of one-bits or the second counted series of zero-bits has a length that is 256 bits more than the overall length of the instruction registers of all of the devices on the scan chain, and the other counted series has a shorter length. Thus, the overall length of the instruction registers of all of the devices on the scan chain is 256 less than the maximum of the number of one-bits in the first counted series and the number of zero-bits in the second counted series.

Decision 306 checks whether a (another if iterating) pair of sub-sequences of unidentified devices is included within the sequence of devices on the scan chain such that the first sub-sequence of the pair is separated in succession from the second sub-sequence of the pair in the scan chain by a sub-sequence of identified device(s). If the scan chain includes another such pair of sub-sequences, process 300 proceeds to step 310. Otherwise, process 300 proceeds to step 308.

At step 310, a trial position is determined for the instruction shift register of an identified device on the scan chain between the two sub-sequences. When the scan chain includes multiple identified devices between the two sub-sequences of unidentified devices, the trial position may be determined for any one of these identified devices.

In one embodiment, the trial position for the identified device may initially be determined by presuming the minimum length of two bits for certain instruction shift registers that have an unknown length. For each sub-sequence of unidentified devices, the total length of the instruction shift registers of the unidentified devices in the sub-sequence may be presumed initially to be twice the number of unidentified devices in the sub-sequence. The trial position of the identified device may be measured from either the start or the end of the scan chain. The trial position may initially be a sum of the actual or presumed lengths of the instruction shift registers between the identified device and the start or the end of the scan chain. For each iteration of step 310, the trial position may be adjusted by shifting the preceding trial position by one bit.

At step 312, an instruction shift attempts to set the instruction register of the identified device between the two sub-sequences of unidentified devices. The instruction shift attempts to set the instruction register of the identified device to the identification instruction. The instruction shift attempts to set the instruction registers of the other devices on the scan chain to the bypass instruction.

At step 314, a data shift obtains data from the scan chain. If the instruction register of the identified device was successfully set to the identification instruction of the identified device, then the data shift obtains the identification value for the identified device and one zero-bit for all of the other devices on the scan chain. Otherwise, the data shift may obtain unpredictable values.

Decision 316 checks whether the expected identification value was received for the identified device between the successive pair of sub-sequences of unidentified devices. If the expected identification value was not received, process 300 returns to step 310 to check the next possible position of the instruction shift register of the identified device. If the expected identification value was received, process 300 returns to decision 306 to check whether the scan chain includes another successive pair of sub-sequences of unidentified devices.

At step 308, the total length of the instruction registers is determined for each sub-sequence of unidentified devices. The length of the instruction registers of a sub-sequence of unidentified devices may be determined from a difference between the actual position of the instruction shift register of an identified device before the sub-sequence and the actual position of the instruction shift register of an identified device after the sub-sequence. The length of the instruction registers of a sub-sequence of unidentified devices may be this difference reduced by the lengths of the instruction registers of the appropriate identified devices. For a sub-sequence of unidentified devices at the end of the scan chain, the total length of the instruction registers of this sub-sequence may be the overall length of the scan chain determined at step 304 reduced by the total length of any other sub-sequences of unidentified devices and the length of the instruction registers of all the identified devices on the scan chain.

At step 320, the database may be updated with information for certain unidentified devices. If a sub-sequence of unidentified devices is a sub-sequence that includes only one unidentified device and this unidentified device has a device identification register, the database may be updated to include the identifier from the device identification register of the unidentified device and the length of the instruction register for the unidentified device. Because the sub-sequence includes only one unidentified device, the total length of the instruction registers in the sub-sequence is the length of the instruction register of the unidentified device. Thus, an unidentified device may become identifiable.

Figure 4:
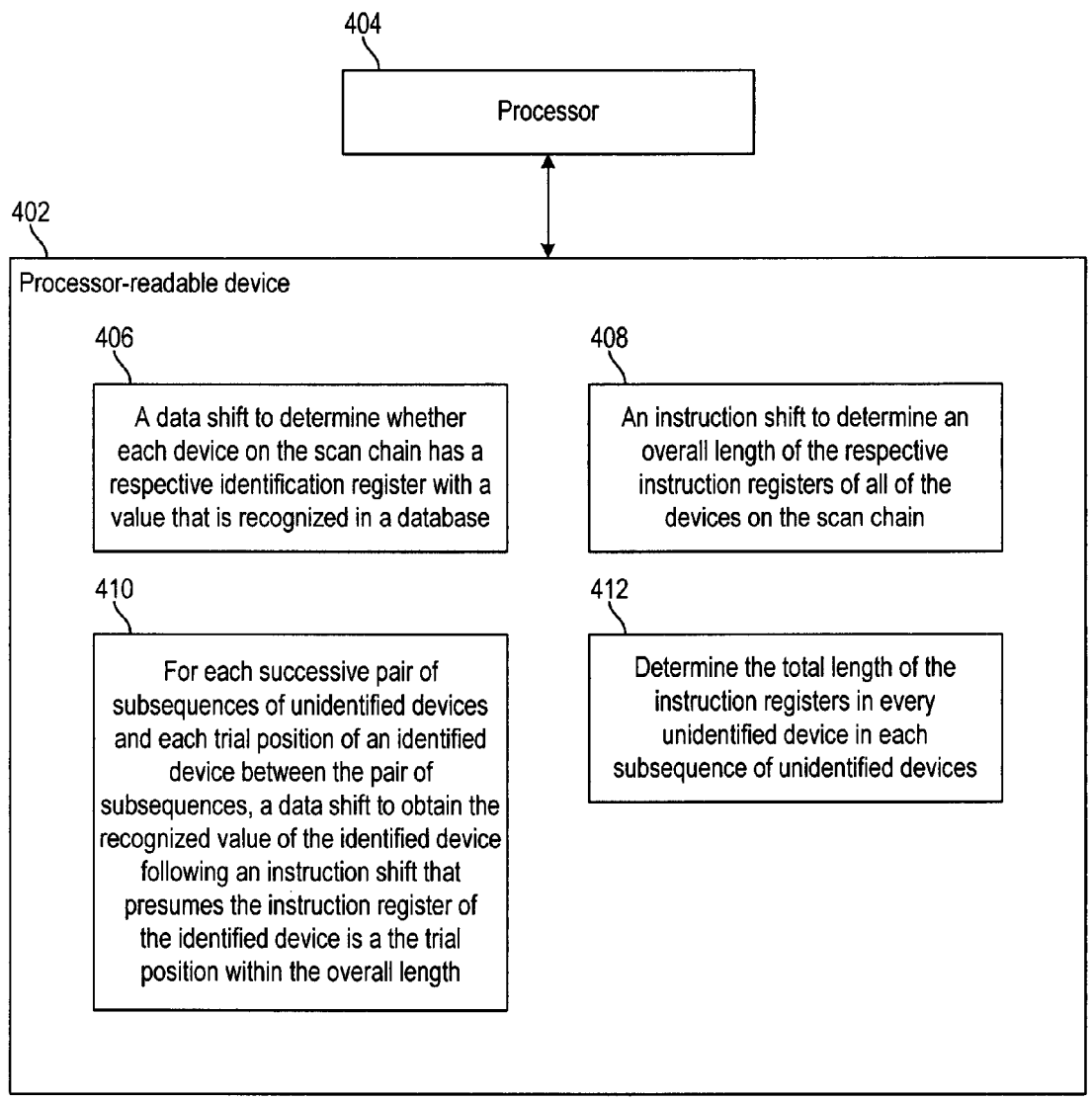
FIG. 4 is a block diagram of a system for determining a total length of one or more instruction registers in accordance with one or more embodiments of the invention.

FIG. 4 is a block diagram of a system for determining a total length of one or more instruction registers in accordance with one or more embodiments of the invention. A processor-readable device 402 may be configured with instructions for determining the total length of one or more instruction registers of devices on a scan chain. A processor 404 may execute the instructions from software modules 406, 408, 410, and 412 of the processor-readable device 402.

Execution of the instructions in software module 406 by processor 404 may cause processor 404 to determine from a data shift of the scan chain whether each of a sequence of devices on the scan chain is an identified device. For each device that includes a device identification register, the data shift may obtain the value of the device identification register. A database of identifiable devices may be checked to determine whether the value of the device identification register is a recognized value.

Execution of the instructions in software module 408 by processor 404 may cause processor 404 to determine an overall length of the respective instruction registers of the devices in the sequence from an instruction shift of the scan chain.

Execution of the instruction in software module 410 by processor 404 may cause processor 404 to determine the actual position within the overall length of the instruction register of an identified device between each successive pair of sub-sequences of unidentified devices. An instruction shift of the scan chain may presume that the instruction register of the identified device is at one or more trial positions. If a data shift of the scan chain obtains the a recognized value of the identification register of the identified device for one of the trial positions, this trial position is the actual position within the overall length of the instruction register of an identified device.

Execution of the instructions in software module 412 by processor 404 may cause processor 404 to determine the total length of the instruction registers of every unidentified device in each sub-sequence of the unidentified devices. The total length of the instruction registers in a sub-sequence of unidentified device may be a function of the overall length of the scan chain and the actual position for the identified device between each successive pair of sub-sequences of unidentified devices. The total length of the instruction registers in a sub-sequence of unidentified device may also be a function of a length of the instruction register of each identified device. The length of the instruction register of each identified device may be obtained from the database of the identifiable devices.

What is claimed is:

1. A processor-implemented method for determining a total length of one or more instruction registers of one or more unidentified devices in a scan chain of a plurality of devices having respective instruction registers, the processor-implemented method comprising:

determining from a first data shift of the scan chain whether each of the plurality of devices is an identified device that has a respective identification register with a recognized value;

determining an overall length of the instruction registers of the plurality of devices in the scan chain from a first instruction shift of the scan chain;

for each pair of sub-sequences of unidentified ones of the plurality of devices in the scan chain, wherein a first and second sub-sequence of the pair are separated in the scan chain by a third sub-sequence of at least one identified device, determining an actual position within the overall length for the respective instruction register of an identified device of the third sub-sequence in response to, for each of at least one trial position within the overall length, a second data shift of the scan chain obtaining the recognized value of the respective identification register of the identified device following a second instruction shift of the scan chain that attempts to set the respective instruction register of the identified device at the trial position; and determining the total length of the instruction register of every unidentified device in each of the sub-sequences of the unidentified devices as a function of the overall length of the instruction registers of the plurality of devices, the actual position of the identified device for each pair of the sub-sequences of the unidentified devices, and a length of the respective instruction register of each identified device.

2. The processor-implemented method of claim 1, wherein the determining of whether each of the plurality of devices is an identified device includes determining that each of the plurality of devices in the scan chain that does not have an identification register is an unidentified device, determining that each of the plurality of devices in the scan chain that has an identification register without a recognized value in a database is an unidentified device, and determining that each of the plurality of devices in the scan chain that has an identification register with a recognized value in the database is an identified device.

3. The processor-implemented method of claim 1, wherein the determining of the overall length of the instruction registers of the plurality of devices in the scan chain includes determining the overall length of the instruction registers of the plurality of devices in the scan chain from the first instruction shift, which provides a first counted series of one-bits to the scan chain until a long length, which is greater than an expected length for an instruction register, of one-bits are consecutively observed from the scan chain and provides a second counted series of zero-bits to the scan chain until the long length of zero-bits are consecutively observed from the scan chain, the overall length being the long length less than a maximum of a number of one-bits in the first counted series and a number of zero-bits in the second counted series.

4. The processor-implemented method of claim 3, wherein the long length is 256 bits.

5. The processor-implemented method of claim 1, wherein the determining the actual position within the overall length for the respective instruction register of the identified device of the third sub-sequence includes the second instruction shift of the scan chain attempting to set the respective instruction registers of the plurality of devices to select the respective identification register for the identified device and to select a respective bypass register for devices in the plurality of devices other than the identified device.

6. The processor-implemented method of claim 1, wherein the determining the total length of the instruction register of every unidentified device in each of the sub-sequences of the unidentified devices includes, determining the total length of the instruction register of every unidentified device in one of the sub-sequences of the unidentified devices as the overall length of the instruction registers of the plurality of devices reduced by the length from a database of the respective instruction register for all of the identified devices in the scan chain and also reduced by the total length of all of the sub-sequences of the unidentified devices other than the one of the sub-sequences of the unidentified devices.

7. A program storage medium, comprising:
a processor-readable device configured with instructions for determining a total length of at least one instruction register of one or more unidentified devices in a scan chain of a plurality of devices having respective instruction registers, wherein execution of the instructions by one or more processors causes the one or more processors to perform operations including,
determining from a first data shift of the scan chain whether each of the plurality of devices is an identified device that has a respective identification register with a recognized value in a database;
determining an overall length of the instruction registers of the plurality of devices in the scan chain from a first instruction shift of the scan chain;
for each pair of sub-sequences of unidentified ones of the plurality of devices in the scan chain, wherein a first and second sub-sequence of the pair are separated in the scan chain by a third sub-sequence of at least one identified device, determining an actual position within the overall length for the respective instruction register of an identified device of the third sub-sequence in response to, for each of at least one trial position within the overall length, a second data shift of the scan chain obtaining the recognized value of the respective identification register of the identified device following a second instruction shift of the scan chain that attempts to set the respective instruction register of the identified device at the trial position; and
determining the total length of the instruction register of every unidentified device in each of the sub-sequences of the unidentified devices as a function of the overall length of the instruction registers of the plurality of devices, the actual position of the identified device for each pair of the sub-sequences of the unidentified devices, and a length from the database of the respective instruction register of each identified device.

8. A system for determining a total length of at least one instruction register, comprising:
a plurality of devices each having a respective instruction register, wherein the plurality of devices are coupled to form a scan chain; and
a scan controller coupled to the scan chain, the scan controller adapted to determine from a first data shift of the scan chain whether each of the plurality of devices is an identified device that has a respective identification register with a recognized value, the scan controller further adapted, for each of a plurality of sub-sequences of unidentified ones of the plurality of devices, to determine a total length of the instruction register of every unidentified device in the sub-sequence, including determining an overall length of the instruction registers of the plurality of devices from a first instruction shift of the scan chain, and determining, for each pair of a first and second sub-sequence of unidentified devices that are separated in the scan chain by a third sub-sequence of at least one identified device, an actual position within the overall length for the respective instruction register of an identified device of the third sub-sequence, the scan controller further adapted to determine the actual position within the overall length for the respective instruction register of the identified device using each of at least one trial position, wherein the trial position is determined to be the actual position in response to a second data shift of the scan chain obtaining the recognized value of the respective identification register of the identified device following a second instruction shift of the scan chain that attempts to set the respective instruction registers of the plurality of devices to select the respective identification register for the identified device and to select a respective bypass register for devices in the plurality of devices other than the identified device.

9. The system of claim 8, wherein the scan controller is further adapted to generate an asserted test mode signal for at least five cycles of a test clock for producing a reset for each of the plurality of devices in the scan chain, the devices of the plurality of devices that have the respective identification register adapted to set the respective instruction register to select the respective identification register in response to the reset, the devices of the plurality of devices that do not have an identification register adapted to set the respective instruction register to select the respective bypass register in response to the reset, the scan controller further adapted after the reset to control the test mode signal for advancing to an capture-data state for each of the plurality of devices in the scan chain, the plurality of devices further adapted to set the respective bypass register to a zero-bit in response to the advancing to the capture-data state, the scan controller further adapted after advancing to the capture-data state to control the test mode signal for performing the first data shift of the scan chain in a repeated shift-data state, the scan controller further adapted to determine that a next device in the plurality of devices in the scan chain does not have an identification register in response to receiving a zero-bit from the first data shift of the scan chain and to determine that the next device in the plurality of devices in the scan chain does have the respective identification register in response to receiving a one-bit followed by a thirty-one-bit identification value, the scan controller further adapted to check the thirty-one-bit identification value against a database to determine whether the next device is an identified device in response to the thirty-one-bit identification value being present in the database as the recognized value, the scan controller further adapted to provide a plurality of one-bits to the scan chain during the first data shift and to complete the first data shift and exit the shift-data state upon obtaining the thirty-one-bit identification value that is all one-bits.

10. The system of claim 8, wherein the scan controller is further adapted to determine the overall length of the instruction registers of the plurality of devices from the first instruction shift, which provides a first counted series of one-bits to the scan chain until 256 one-bits are consecutively observed from the scan chain and provides a second counted series of zero-bits to the scan chain until 256 zero-bits are consecutively observed from the scan chain, the overall length being 256 less than a maximum of a number of one-bits in the first counted series and a number of zero-bits in the second counted series.

11. The system of claim 10, wherein the scan controller is further adapted to control a test mode signal for advancing to an capture-instruction state before providing each of the first and second counted series to the scan chain, and the plurality of devices are further adapted to update the instruction registers to include a less significant one-bit and a next more significant zero-bit in response to the advancing to the capture-instruction state.

12. The system of claim 8, wherein the scan controller is further adapted to determine from a database that the respective identification register has the recognized value for an identified device, and the scan controller is further adapted to determine the total length of the instruction register of every unidentified device in each sub-sequence of the unidentified devices as a function of the overall length of the instruction registers of the plurality of devices, the actual position of the respective instruction register of the identified device for each pair of the sub-sequences of the unidentified devices, and a length from the database of the respective instruction register for each identified device.

13. The system of claim 12, wherein the scan controller is further adapted to attempt, for each of the at least one trial position, to set the respective instruction register of the identified device with an identification code from the database for selecting the respective identification register of the identified device, and to set the respective instruction registers of the plurality of devices other than the identified device to a value of all one-bits for selecting the respective bypass registers.

14. The system of claim 12, wherein the scan controller is further adapted, for each pairing of one of the sub-sequences of unidentified devices and a successive one of the identified devices in the scan chain beginning from a start of the scan chain, to determine the total length of the instruction register of every unidentified device in the sub-sequence as the actual position within the overall length of a beginning of the respective instruction register of the identified device reduced by the length from the database of the respective instruction register for all of the identified devices before the identified device in the scan chain and also reduced by the total length of all of the sub-sequences of unidentified devices before the sub-sequence in the scan chain.

15. The system of claim 14, wherein the scan controller is further adapted to determine the actual position within the overall length for the respective instruction register of the identified device using each of the at least one trial position that increases starting from a sum of twice a number of the unidentified devices in the sub-sequence, the length from the database of the respective instruction register for all of the identified devices before the identified device in the scan chain, and the total length of all of the sub-sequences of unidentified devices before the sub-sequence in the scan chain.

16. The system of claim 12, wherein the scan controller is further adapted, for each pairing of one of the identified devices and a successive one of the sub-sequences of unidentified devices in the scan chain beginning from an end of the scan chain, to determine the total length of the instruction register of every unidentified device in the sub-sequence as the overall length of the instruction registers of the plurality of devices reduced by the actual position within the overall length of an end of the respective instruction register of the identified device and also reduced by the length from the database of the respective instruction register for all of the identified devices after the identified device in the scan chain and finally reduced by the total length of all of the sub-sequences of unidentified devices after the sub-sequence in the scan chain.

17. The system of claim 16, wherein the scan controller is further adapted to determine the actual position within the overall length for the respective instruction register of the identified device using each of the at least one trial position that decreases starting from a difference between the overall length of the instruction registers of the plurality of devices and a sum of twice a number of the unidentified devices in the sub-sequence, the length from the database of the respective instruction register for all of the identified devices after the identified device in the scan chain, and the total length of all of the sub-sequences of unidentified devices after the sub-sequence in the scan chain.

18. The system of claim 12, wherein the scan controller is further adapted to determine the total length of the instruction register of every unidentified device in one of the sub-sequences of unidentified devices as the overall length of the instruction registers of the plurality of devices reduced by the length from the database of the respective instruction register for all of the identified devices in the scan chain and also reduced by the total length of all of the sub-sequences of unidentified devices other than the sub-sequence.

19. The system of claim 18, wherein the sub-sequence of unidentified devices is at one of a start and an end of the scan chain.

20. The system of claim 12, wherein the scan controller is further adapted, for each of the sub-sequences of unidentified devices that has only one unidentified device with an identification register, to update the database with a value from the identification register of the unidentified device from the first data shift and the total length of the respective instruction register of the unidentified device.

* * * * *